(12) United States Patent
Huynh et al.

(10) Patent No.: US 6,287,178 B1
(45) Date of Patent: Sep. 11, 2001

(54) WAFER CARRIER RINSING MECHANISM

(75) Inventors: Cuc Kim Huynh, Jericho; Paul A. Manfredi, Waterbury Center; Thomas J. Martin, Franklin; Douglas P. Nadeau, Underhill; Joseph M. Weatherwax, Jr., Fairfax, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/357,252

(22) Filed: Jul. 20, 1999

(51) Int. Cl.[7] .................................................. B24B 55/12
(52) U.S. Cl. ................................ 451/73; 451/54; 239/556
(58) Field of Search ................................ 451/54, 65, 67, 451/73, 288; 134/902, 23, 148, 153, 198; 239/556, 560, 568, 392

(56) References Cited

U.S. PATENT DOCUMENTS

| 4,519,846 | * | 5/1985 | Aigo ........................................ 134/15 |
| 5,349,978 | * | 9/1994 | Sago et al. ............................ 134/153 |
| 5,655,954 | * | 8/1997 | Oishi et al. ............................ 451/67 |
| 5,779,816 | * | 7/1998 | Trinh ..................................... 134/23 |
| 5,804,507 | | 9/1998 | Perlov et al. . |

\* cited by examiner

*Primary Examiner*—Robert A. Rose
(74) *Attorney, Agent, or Firm*—Schmeiser, Olsen & Watts; Robert A. Walsh

(57) ABSTRACT

A carrier rinse unit comprising a plurality of nozzles prepositioned to eject a cleaning fluid against a surface of a wafer while the wafer is rotated within a wafer carrier. The prepositioned nozzles may be angled to spray a leading edge, a trailing edge, an outer edge of the wafer, or any desired point on the surface of the wafer.

10 Claims, 4 Drawing Sheets

WAFER CARRIER RINSING MECHANISM

BACKGROUND OF THE INVENTION

1. Technical Field

The present invention relates generally to multi-step chemical mechanical polishing processes and, more particularly, to a wafer carrier rinsing mechanism.

2. Related Art

Chemical-mechanical polishing (hereinafter "CMP"), is a common method of planarization used in semiconductor manufacture. CMP typically involves the use of a circular polishing pad, mounted to a polishing table or platen, which is held in contact with the surface of the semiconductor wafer via a carrier. An abrasive slurry, typically water-based, is applied to the surface of the polishing pad to facilitate and enhance polishing of the wafer. During a polishing process, both the polishing pad and wafer are rotated relative to one another. As a result, unwanted material is removed from the surface of the wafer, producing a planarized surface. Once complete, the wafer can be transported to a subsequent processing step, e.g., a secondary polishing operation, or a cleaning process.

However, after a polishing operation, residual foreign materials tend to remain on the surface of the polished wafer, which in turn can lead to cross contamination with subsequent processing steps. Because each subsequent processing step can be adversely affected by residual foreign materials from a previous step, failure to adequately reduce such contamination can lead to higher costs. Furthermore, eliminating the cross contamination is becoming more and more vital as the level of precision required for higher integrated circuit (IC) device densities increases. Accordingly, a need exists for improved tools for eliminating cross contamination in CMP processing.

SUMMARY OF THE INVENTION

The present invention provides an apparatus for removing foreign materials from a semiconductor wafer and wafer carrier that holds the wafer in place. The apparatus comprises a washer assembly having a plurality of prepositioned nozzles for ejecting a fluid against a surface of the wafer while the carrier is rotating in order to cleanse either/both the wafer surface and the wafer carrier. The washer assembly may include a first plurality of nozzles positioned for spraying a leading edge of the wafer surface, a second plurality of nozzles positioned for spraying a trailing edge of the wafer surface, and a third plurality of nozzles positioned outwardly (i.e., away from the center of the wafer) for forcing foreign materials towards an edge of the wafer surface. The washer assembly may also, for example, include nozzles that are positioned to both spray a leading edge of the wafer and force foreign materials towards an edge of the wafer, or alternatively, positioned to spray a trailing edge and force foreign materials towards an edge of the wafer. In addition, each nozzles can be altered to control the spray pattern associated with the nozzle.

DETAILED DESCRIPTION OF THE PREFERRED EMBODIMENT

Figure 1:
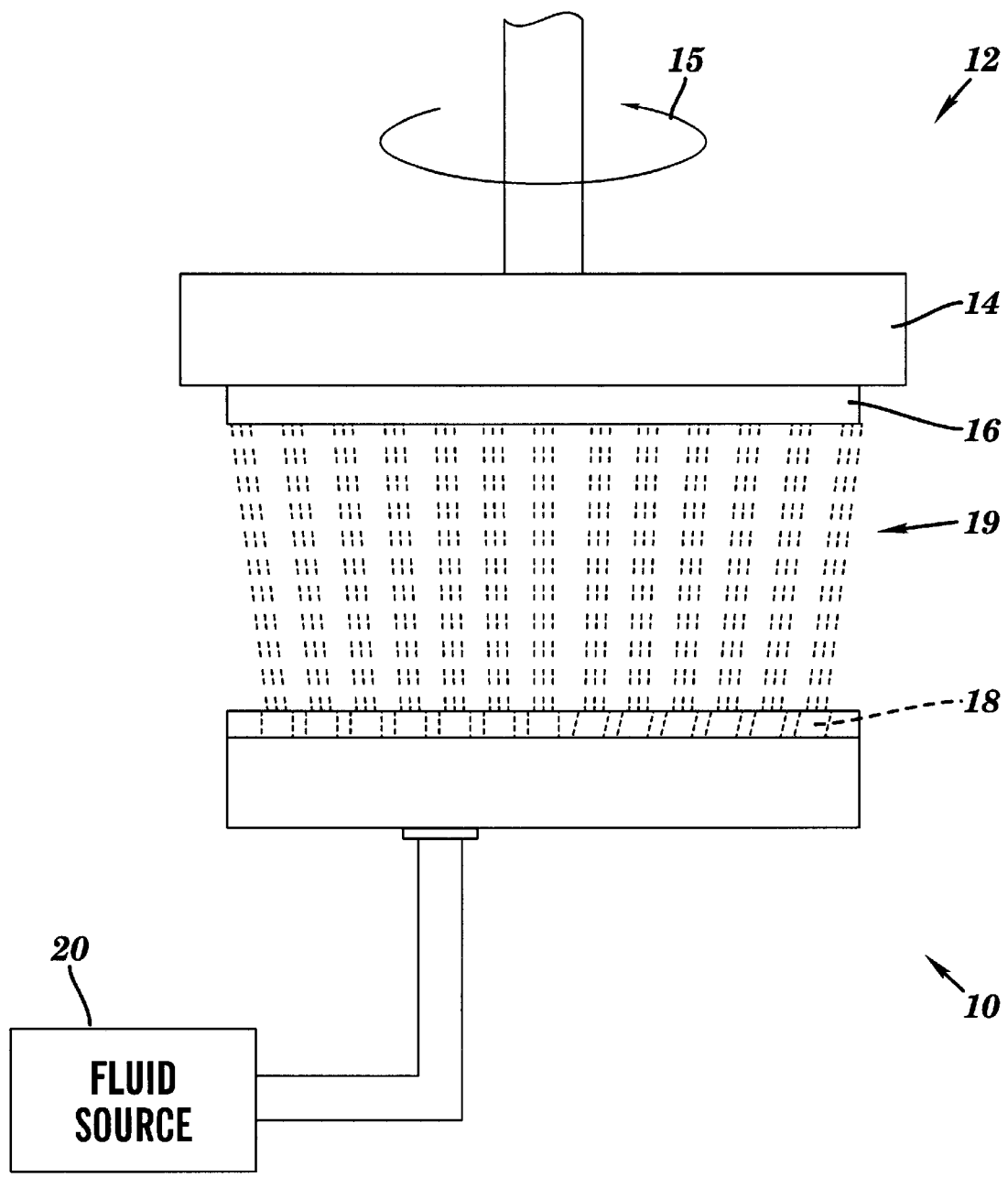
FIG. 1 depicts a side view of a carrier rinse system and carrier in accordance with a preferred embodiment of the present invention.

Referring now to the figures, FIG. 1 depicts a wafer carrier 12 being sprayed by a rinse unit 10 in accordance with the present invention. Wafer carrier 12 includes a wafer holder 14 and wafer 16 that can be rotated in the direction of arrow 15. Wafer carrier 12 can be any type known in the art, including a WESTECH™ carrier. Rinse unit 10 comprises a plurality of nozzles 18 positioned to spray a fluid 19 towards wafer 16 as the wafer 16 is rotated by the wafer carrier 12. Fluid 19 is pumped from a fluid source 20 into the rinse unit 10 for disbursement through the nozzles 18.

It is envisioned that the rinse unit 10 could be used to cleanse the wafer carrier 12 and wafer 16 after/before any of the steps commonly utilized in a CMP process. For example, in between a primary and secondary polishing operation, the wafer 16 could be rinsed off with the rinse unit 10 in order reduce the amount of chemical cross-contamination. In addtion, the rinse unit 10 could be used to cleanse wafer holder 14 before the wafer 16 is placed onto the wafer holder 14 in order to ensure a contaminate free surface. Furthermore, the rinse unit 10 could be used after the polishing process and prior to the cleaning process, or at any other stage where the elimination of residual foreign materials is desired.

It should be further recognized that the exact placement and configuration of nozzles 18 can be altered without departing from the scope of this invention. Moreover, it is envisioned that the invention could be implemented in such a manner where wafer carrier 12 could remain stationary, while the rinse unit 10 is spun around.

Figure 2:
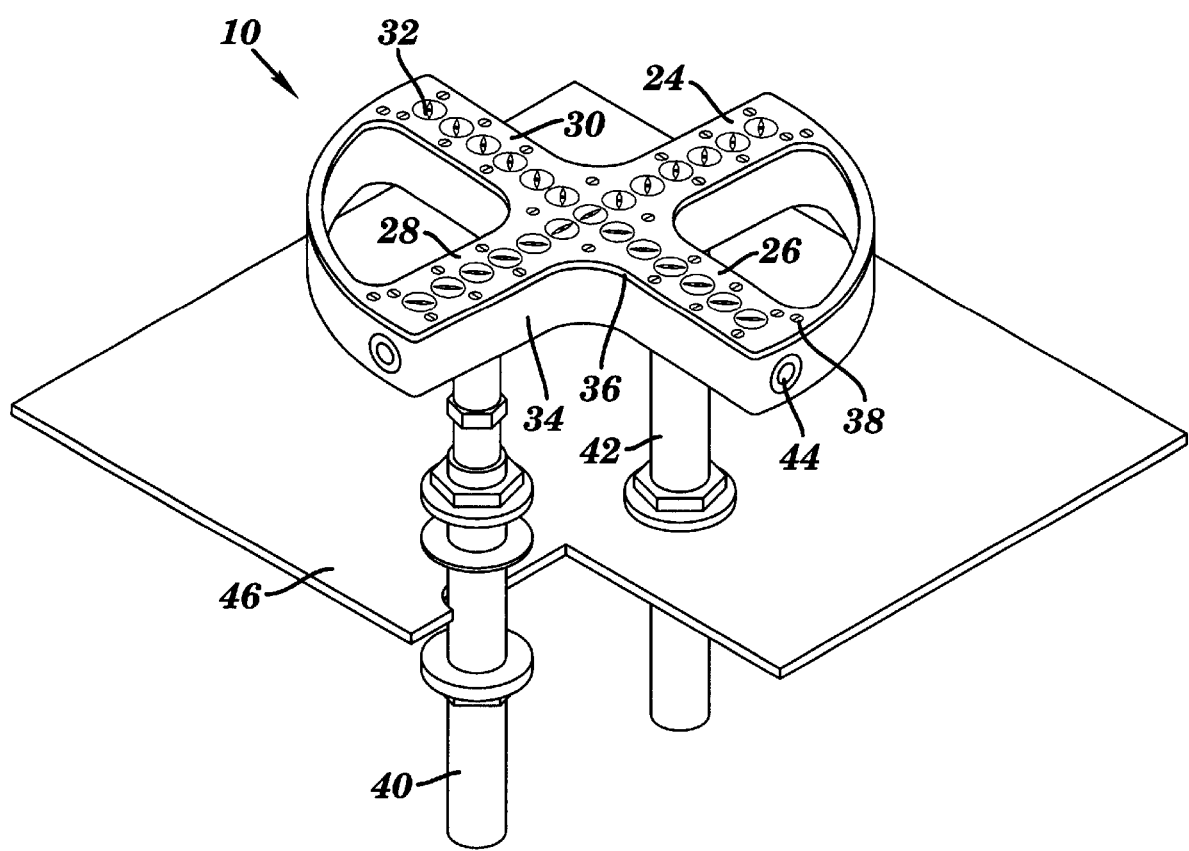
FIG. 2 depicts an isometric view of a carrier rinse mechanism in accordance with a preferred embodiment of the present invention.

Referring now to FIG. 2, an isometric view of the rinse unit 10 is depicted. The rinse unit 10 comprises four nozzle banks 24, 26, 28 and 30. Each of the banks comprises a plurality of nozzles 32 for ejecting a spray in a direction toward the wafer carrier and wafer (not shown). The rinse unit 10 includes a base portion 34 and a plate 36. The plate 36 is secured to the base portion 34 with screws 38 and holds the nozzles 32 in position. The rinse unit 10 is mounted on top of posts 40 and 42, which are hollowed-out to provide passage of fluid into the rinse unit 10. The rinse unit 10 may be mounted on a flat surface 46 with nozzles pointed generally upward, or any other suitable configuration (e.g., horizontally or downward). The rinse unit 10 comprises hollowed out passageways (not shown) for delivering fluid to each of the nozzles 32. The rinse unit 10 may include plugs 44 at the end of each nozzle bank to provide access or closure to the hollowed-out passageways. The rinse unit 10 may be made from any type of material, including plastic or metal, that can provide a system for mounting nozzles and delivering a fluid.

Figure 3:
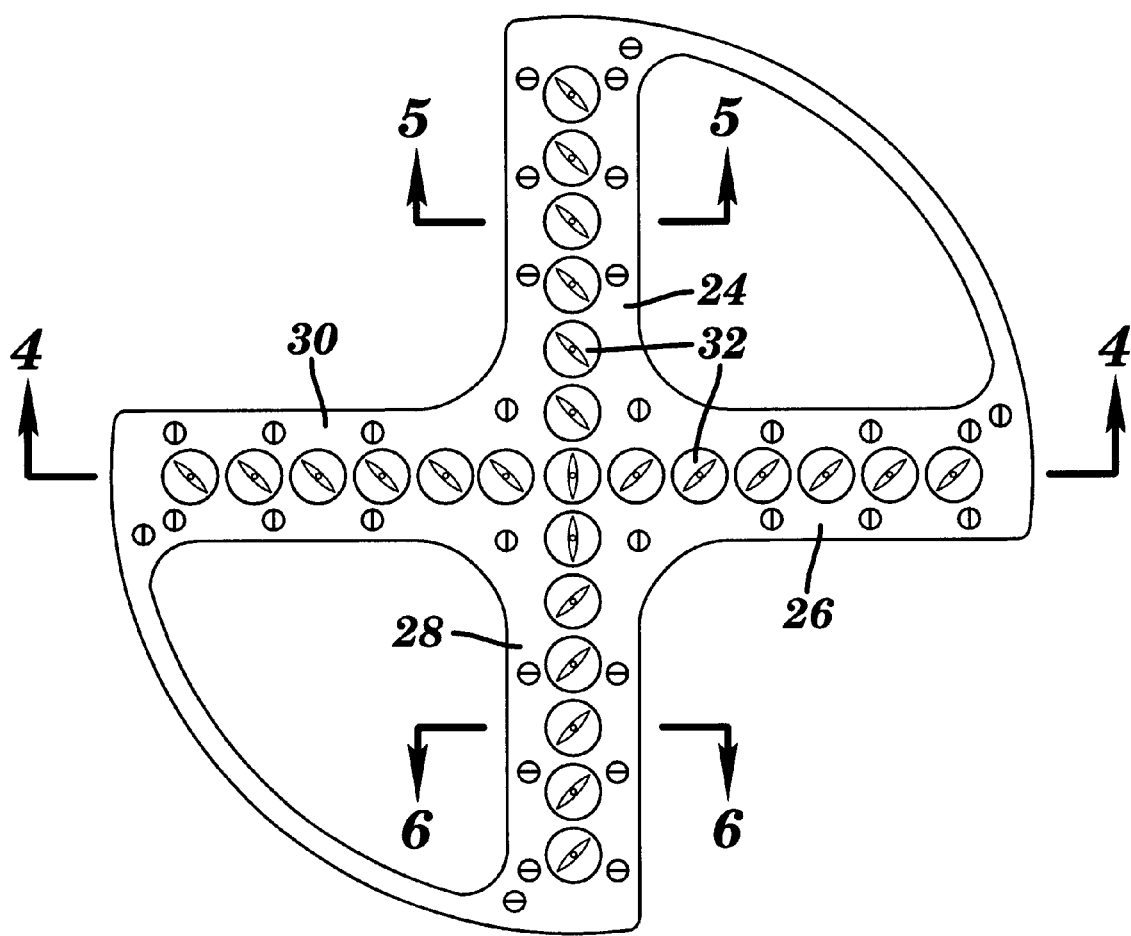
FIG. 3 depicts a top view of a carrier rinse mechanism in accordance with a preferred embodiment of the present invention.

Referring now to FIG. 3, a top view of the rinse unit 10 is depicted. As can be seen, the four nozzle banks 24, 26, 28 and 30 are arranged in an x-shape. While this embodiment depicts banks of nozzles in an x-shape including four nozzle banks, it is understood that any nozzle layout falls within the scope of this invention. Each nozzle bank comprises a plurality of nozzles 32. As the wafer (not shown) is rotated above the rinse unit 10, fluid will be pumped into each nozzle bank 24, 26, 28 and 30 and through each of the nozzles 32 to remove foreign material from the wafer. Each of the nozzles 32 may be angled in a predetermined direction to control the spray angle. The nozzles 32 may be fixed (e.g., machined) to a predetermined angle, or be positionable (e.g., using bearings, etc.) by the user. Thus, the fluid being ejected from each nozzle 32 in the rinse unit 10 may be directed straight up, angled in a first direction for spraying a leading edge of the wafer surface as it passes the nozzle, angled in a second direction for spraying a trailing edge of the wafer surface as it passes the nozzle, or angled outward to force foreign material towards the edge of the wafer. In addition, the nozzles can be angled in a combination of directions to achieve a device result. For example, the nozzles 32 can be angled to spray toward both a leading edge of the wafer as it approaches and towards an outside edge of the wafer. Similarly, the nozzles can be angled to spray towards a trailing edge and towards an outside edge of the wafer. In general, each of the nozzles 32 within a given bank of nozzles will be angled to spray in a similar direction, e.g., to spray towards a leading edge in a non-overlapping manner. Some of the various nozzle angles achievable with this invention are further described in FIGS. 4–6.

Figure 4:
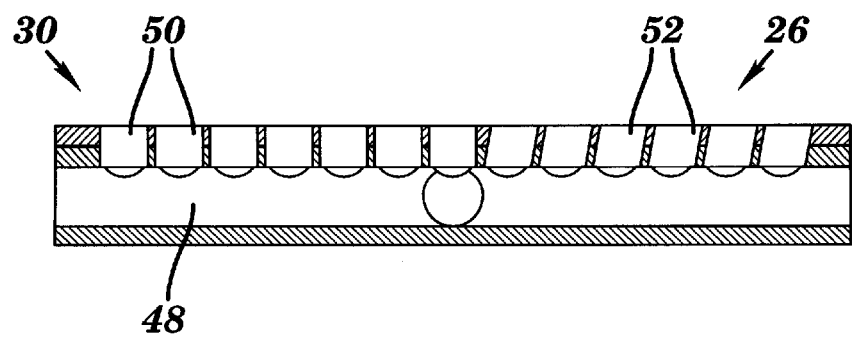
FIG. 4 depicts a side view taken along section 4—4 of the carrier rinse system of FIG. 3, in accordance with a preferred embodiment of the present invention.

Referring to FIG. 4, a cross-sectional side view taken along section 4—4 of FIG. 3 is depicted showing nozzle banks 30 and 26. Nozzle bank 30 comprises a plurality of nozzles receptors 50 that are oriented in a generally vertical direction in order to produce a vertical spray direction. In contrast, nozzle receptors 52 are angled outward towards the edge of the wafer (not shown) such that as the wafer rotates foreign material is forced towards an edge of the wafer surface. Also shown in FIG. 4 is passageway 48 which is used to deliver fluid to each of the nozzle receptor s 50, 52. Each of the nozzle receptors includes means, such as threaded side walls, for receiving a nozzle. Alternatively, the nozzles could be integrated into the nozzle bank as a one-piece system.

Figure 5:
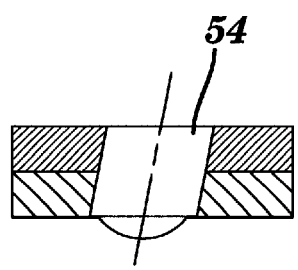
FIG. 5 depicts a cross-sectional side view taken along section 5—5 of FIG. 3 in accordance with a preferred embodiment of the present invention.
Figure 6:
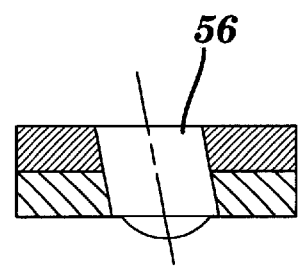
FIG. 6 depicts a cross-sectional side view of section 6—6 of FIG. 3 in accordance with a preferred embodiment of the present invention.

Referring now to FIG. 5, a cross-sectional side view taken along section 5—5 of FIG. 3 is depicted. Here it can be seen that the nozzle receptor 54 is angularly offset to the right when viewed from the center of the rinse unit, thereby providing a spray direction suitable for spraying a leading edge of the wafer as the wafer rotates (assuming a counter-clockwise rotation). FIG. 6 depicts a cross-section of section 6—6 of FIG. 3 having a nozzle receptor 56 that is angled in a left direction when viewed from the center of the rinse unit in order to provide a spray direction suitable for spraying a trailing edge of the wafer as it rotates (assuming a counter-clockwise rotation).

Figure 7:
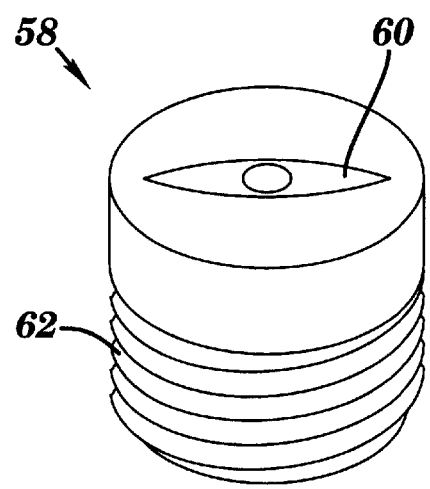
FIG. 7 depicts a nozzle in accordance with a preferred embodiment of the present invention.

In addition to controlling the nozzle angle, the spray pattern achievable by each nozzle may likewise be altered. Referring to FIG. 7, a nozzle 58 with an aperture 60 is depicted having threading 62 for mounting into a nozzle receptor. Because of the elongated shape of the aperture 60 on nozzle 58, a wide, fanned-out type spray pattern would be produced. Thus, the user can vary the direction of the spray pattern by turning the nozzle 58 to a desired position. For example, the elongated spray pattern could be directed in more of an up/down pattern, or more of a left/right pattern. Moreover, the user can choose among different types of nozzles (not shown) to produce a desired spray pattern (e.g., fine, circular, etc.). Once all of the desired nozzles are installed and a direction for each nozzle is chosen, the nozzles can be locked into position by screwing down plate 36 on top of the base 34 (see FIG. 2). It is understood that any system for securing the nozzles in place (e.g., screw, clamp, etc.) could likewise be used.

Thus, the present invention provides enhanced spray control by allowing the user to choose: (1) the angle of the nozzle receptor, and hence the angle of the nozzle; (2) the type of nozzle, and hence the particular spray pattern; and (3) the nozzle direction.

With this invention, a full coverage carrier rinse unit is provided to clean a wafer insitu and carrier after each step in a multi-step CMP process. It is estimated that the rinse unit could operate at any pressure, but preferably will operate between 70 and 120 PSI's. While this invention has been described in conjunction with the specific embodiments outlined above, it is evident that many alternatives, modifications and variations will be apparent to those skilled in the art. Accordingly, the preferred embodiments of the invention set forth above are intended to be illustrative, not limiting. Various changes may be made without departing from the spirit and scope of the invention as defined in the following claims.

What is claimed is:

1. A carrier rinse mechanism for cleaning a wafer supported by a rotating wafer carrier, comprising:
    a first nozzle bank having a first plurality of adjustable nozzles for spraying fluid toward a surface of the wafer, wherein said first plurality of adjustable nozzles are angled in a first direction to spray fluid toward a leading edge of the wafer surface; and
    a second nozzle bank having a second plurality of adjustable nozzles for spraying fluid toward a surface of the wafer, wherein said second plurality of adjustable nozzles are angled in a second direction to spray fluid toward a trailing edge of the wafer surface.

2. The carrier rinse mechanism of claim 1, wherein a third nozzle bank having a third plurality of adjustable nozzles angled outward toward an edge of the wafer surface sprays fluid to force foreign materials towards an edge of the wafer surface.

3. The carrier rinse mechanism of claim 1, wherein a fourth nozzle bank having a fourth plurality of adjustable nozzles sprays fluid against the wafer surface in a direction normal to the wafer surface.

4. An apparatus for removing foreign materials from a semiconductor wafer during a polishing process, comprising:
    a rotatable wafer carrier for holding the wafer in place; and
    a washer assembly having a plurality of nozzle banks, each nozzle bank having a plurality of adjustable nozzles for spraying a fluid against a surface of the wafer in a plurality of different directions while the carrier is rotating in order to cleanse the wafer surface.

5. The apparatus of claim 4, wherein the adjustable nozzles comprise a first set of nozzles positioned for spraying fluid toward a leading edge of the wafer surface.

6. The apparatus of claim 5, wherein the adjustable nozzles comprise a second set of nozzles positioned for spraying fluid toward a trailing edge of the wafer surface.

7. The apparatus of claim 4, wherein the adjustable nozzles are grouped into a plurality of nozzle banks extending outward from a center point of the washer assembly.

8. The apparatus of claim 4, wherein the adjustable nozzles comprises a set of nozzles which are oriented outward toward an edge of the wafer surface in order to spray the fluid to force foreign materials towards the edge of the wafer surface.

9. The apparatus of claim 4, wherein each adjustable nozzle generates a unique spray pattern such that the fluid from any two nozzles do not interfere with each other.

10. The apparatus of claim 4, wherein the adjustable nozzles include a center nozzle that sprays fluid against the wafer surface in a direction normal to the wafer surface.

* * * * *